(12) United States Patent
Charpiot (10) Patent No.: US 10,297,288 B2
(45) Date of Patent: May 21, 2019

(54) SUPPORT FOR COMPUTER DATA BACK-UP UNIT(S)

(71) Applicant: FREEBOX, Paris (FR)

(72) Inventor: Patrick Charpiot, Chatenay Malabry (FR)

(73) Assignee: Freebox, Paris (FR)

( * ) Notice: Subject to any disclaimer, the term of this patent is extended or adjusted under 35 U.S.C. 154(b) by 0 days.

(21) Appl. No.: 15/812,988

(22) Filed: Nov. 14, 2017

(65) Prior Publication Data

US 2018/0137895 A1    May 17, 2018

(30) Foreign Application Priority Data

Nov. 15, 2016  (FR) ..................................... 16 61055

(51) Int. Cl.

| | |
|---|---|
| *G11B 33/02* | (2006.01) |
| *H05K 7/14* | (2006.01) |
| *H05K 7/18* | (2006.01) |
| *G11B 33/12* | (2006.01) |
| *A47B 88/975* | (2017.01) |
| *A47B 88/988* | (2017.01) |
| *H05K 7/02* | (2006.01) |
| *G06F 1/18* | (2006.01) |

(52) U.S. Cl.
CPC .......... *G11B 33/022* (2013.01); *A47B 88/975* (2017.01); *A47B 88/988* (2017.01); *G06F 1/187* (2013.01); *G11B 33/122* (2013.01); *G11B 33/124* (2013.01); *H05K 7/02* (2013.01); *H05K 7/1438* (2013.01); *H05K 7/183* (2013.01)

(58) Field of Classification Search
CPC ..... G06F 1/187; G06F 1/1658; G11B 33/128; G11B 33/122; G11B 33/022; H05K 13/00; H05K 7/02; H05K 7/1438; H05K 7/183; A47B 88/975; A47B 88/988
See application file for complete search history.

(56) References Cited

U.S. PATENT DOCUMENTS

| | | | | |
|---|---|---|---|---|
| 5,921,644 | A  * | 7/1999 | Brunel ................. | G11B 33/124 |
| | | | | 312/223.2 |
| 7,515,410 | B1 | 4/2009 | Dingfelder et al. | |
| 8,152,127 | B2 * | 4/2012 | Chang .................... | G06F 1/182 |
| | | | | 248/346.03 |
| 9,330,730 | B2 * | 5/2016 | Makley ................ | G11B 33/128 |
| 9,360,902 | B1 * | 6/2016 | Yang ........................ | G06F 1/187 |
| 9,443,558 | B1 * | 9/2016 | Hung ................... | G11B 33/124 |
| 9,468,129 | B1 * | 10/2016 | Wang ...................... | G06F 1/187 |

(Continued)

OTHER PUBLICATIONS

Search Report dated Jul. 6, 2017 for corresponding application No. FR 1661055.

*Primary Examiner* — James Wu
(74) *Attorney, Agent, or Firm* — Knobbe, Martens, Olson & Bear, LLP (57) ABSTRACT

A support for computer data back-up units is designed to receive at least two distinct sizes of back-up units. The support has a bottom and at least one stationary wall perpendicular to the bottom. The support also has an additional wall extending perpendicularly to the bottom of the support and parallel to the stationary wall. The additional wall is mounted to be movable relative to the bottom of the support between at least two receiving slots respectively associated with the distinct sizes of the back-up units.

13 Claims, 6 Drawing Sheets

(56) References Cited

U.S. PATENT DOCUMENTS

| | | | |
|---|---|---|---|
| 2005/0198657 A1* | 9/2005 | Wu | G11B 33/022 |
| | | | 720/632 |
| 2008/0172257 A1 | 7/2008 | Bisker et al. | |
| 2011/0005068 A1 | 1/2011 | Zhang et al. | |
| 2011/0069441 A1 | 3/2011 | Killen et al. | |
| 2012/0147545 A1* | 6/2012 | Niu | G06F 1/187 |
| | | | 361/679.31 |

* cited by examiner

SUPPORT FOR COMPUTER DATA BACK-UP UNIT(S)

The invention relates to a support for computer data back-up unit(s) that is configured to receive at least two back-up units of distinct sizes, wherein the support comprises a bottom and at least one stationary wall perpendicular to the bottom.

"Computer data back-up unit" as used hereinafter is understood to mean computer hardware configured for the storage of computer data, such as a single hard disk DD, or a set of HD hard disks, or HDD hard disk drives, or a single disk or a set of disks comprising a solid state drive (SSD).

Two standard sizes of computer data back-up units are currently used, namely 2.5-inch and 3.5-inch.

Various types of support for data back-up units for receiving at least two distinct sizes of computer data back-up units are known.

A first type of these supports is described in the document U.S. Pat. No. 7,515,410 and is based on a set of identical receiving slots corresponding to hard disks for back-up units. Some of these slots are intended to accept 3.5-inch hard drives, while others are intended to accept 2.5-inch hard drives, wherein, to achieve this, each comprises an additional frame, in which is disposed a 2.5-inch hard drive.

A second type of support is disclosed in document US 2008/0172257 and is based on the conversion of a support designed to receive a 3.5-inch hard disk by adding, through screwing, a system of overlapping drawers that are respectively configured to accept the insertion of a 2.5-inch hard drive in each dedicated drawer.

These two types of support for back-up units that are configured to receive at least two distinct sizes of back-up units involve an assembly/disassembly operation, the usage of screws, and the non-usage certain parts (slot/drawers) depending on the size of the back-up units receiving the computer data.

The object of the invention is therefore to propose a support for computer data back-up units that is configured to receive at least two distinct sizes of back-up unit, wherein the changeover between two receiving configurations is made easier for the user, without requiring the use of a tool, and while avoiding parts remaining unused in one or other of the receiving configurations.

The object of the invention is to provide a support for computer data back-up units configured to receive at least two distinct sizes of back-up unit, wherein the support comprises a bottom and at least one stationary wall perpendicular to the bottom, wherein the support further comprises an additional wall extending perpendicularly to the bottom of the support and parallel to the stationary wall, and wherein the additional wall is mounted to be movable with respect to the bottom of the support between at least two receiving slots respectively associated with the distinct sizes of the back-up units.

According to other advantageous aspects of the invention, the computer data storage unit(s) support comprises one or more of the following features, taken in isolation or according to all technically feasible configurations:

- the movable wall is supported on a base to form a movable assembly sliding in at least one rail of the bottom of the support;
- the base extends perpendicularly to the movable wall and opposite to the stationary wall with respect to the movable wall;
- the base is U-shaped and has two grooves open towards the outside of the free ends of the arms of the U-shaped base and interacting with the facing edges of two non-adjacent rails at the bottom of the support;
- the U-shaped base comprises a notch in its central part for the passage of a central rail situated between the two non-adjacent rails on which the movable assembly slides;
- the non-adjacent rails comprise guide profiles whose length is less than the length of the rail;
- the bottom of the support comprises an alternating arrangement of rails of material constituting the support and openings extending in the direction of the width of the support, wherein the rails and the openings are parallel and inclined with respect to the perpendicular to the stationary wall;
- the central rail comprises at least two latching elements respectively configured to wedge the central part of the U of the base to one of the at least two receiving slots of the back-up units respectively associated with the distinct sizes of the back-up units;
- the material surface of the bottom of the support is smaller than the surface of the openings of the bottom of the support;
- the movable assembly may be detached from the support;
- the movable wall comprises:
  - at least one pin on one of its faces that is configured to block, along the height of the support, at least one back-up unit according to one size, and
  - at least one other pin on the other face that is configured to block, along the height of the support, at least one back-up unit according to one other size;
- the movable wall comprises at least two pins on one of its faces that are configured to block, in superposition, along the height of the support, at least two back-up units having the same size;
- at least one pin of the support is retractable or carried by a deformable strip;
- the support is made of a material that is designed to deform upon insertion/removal of the back-up units;
- the material of the support is plastic.

These characteristics and advantages of the invention will become more clear upon reading the description which follows, given solely by way of a non-limiting example, and made with reference to the appended drawings, wherein.

Figure 1:
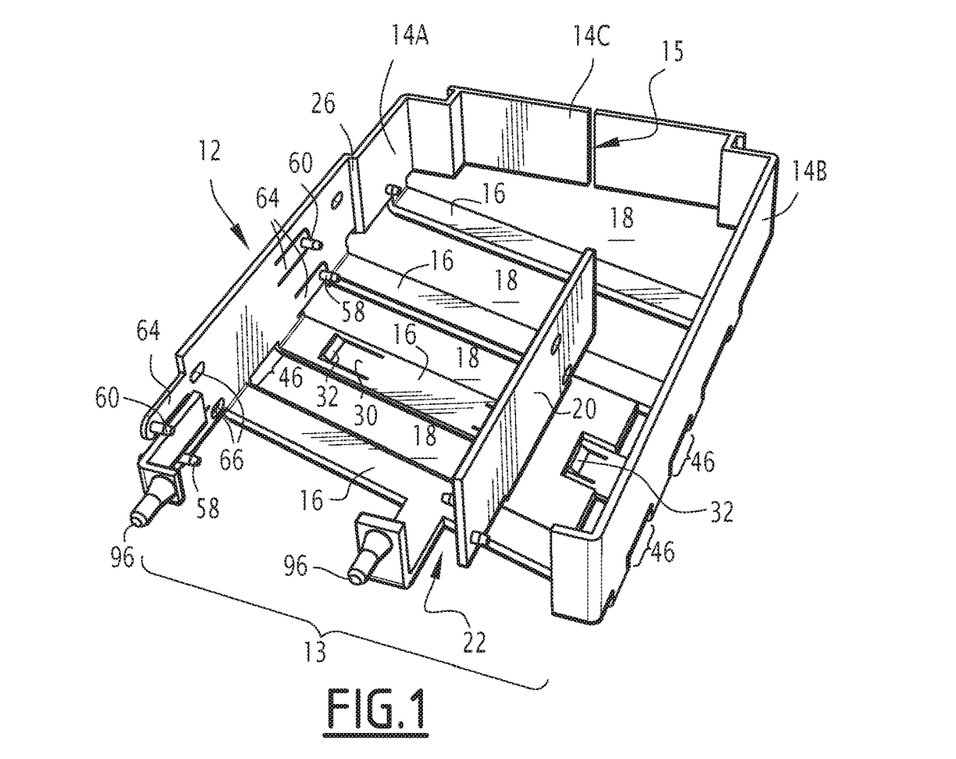
FIGS. 1 and 2 show perspective views from two distinct angles, of two receiving configurations of the same support for back-up units according to the invention and associated with two distinct sizes of back-up unit.

In FIG. 1, the support 12 of the computer data backup units is rectangular. The support 12 comprises, on one side, an opening 13 designed for the connection of backup units. On the other three sides, the support 12 is delimited by two longitudinal walls 14A and 14B and a transverse wall 14C.

These three stationary walls 14A, 14B, 14C together form a frame secured perpendicularly with respect to the bottom of the support 12.

The transverse wall 14C is provided with a gap 15 to allow manual deformation of the support 12 according to the width. The bottom of the support 12 comprises an alternating arrangement of parallel rails 16 of material constituting the support 12 and of openings 18 extending in the direction of the width of the support 12.

The support 12 also comprises an additional wall 20 extending perpendicularly relative to the bottom of the support 12. The wall 20 is parallel to the two stationary longitudinal walls 14A and 14B of the support 12.

According to the invention, the additional wall 20 is movable relative to the bottom of the support 12. In particular, the movable wall 20 may be moved in the direction of the width of the support 12 along a slide rail 16 between two extreme positions in which the wall 20 is applied against one or other of the longitudinal walls 14A and 14B.

In FIG. 1, the movable wall 20 is positioned in an extended position 22 parallel to and between the two longitudinal immobile walls 14A and 14B by sliding on the bottom of the support 12.

The extended position 22 of the movable wall 20 corresponds to a configuration for receiving a first size of a computer data backup unit, for example of 2.5 inches.

Figure 2:
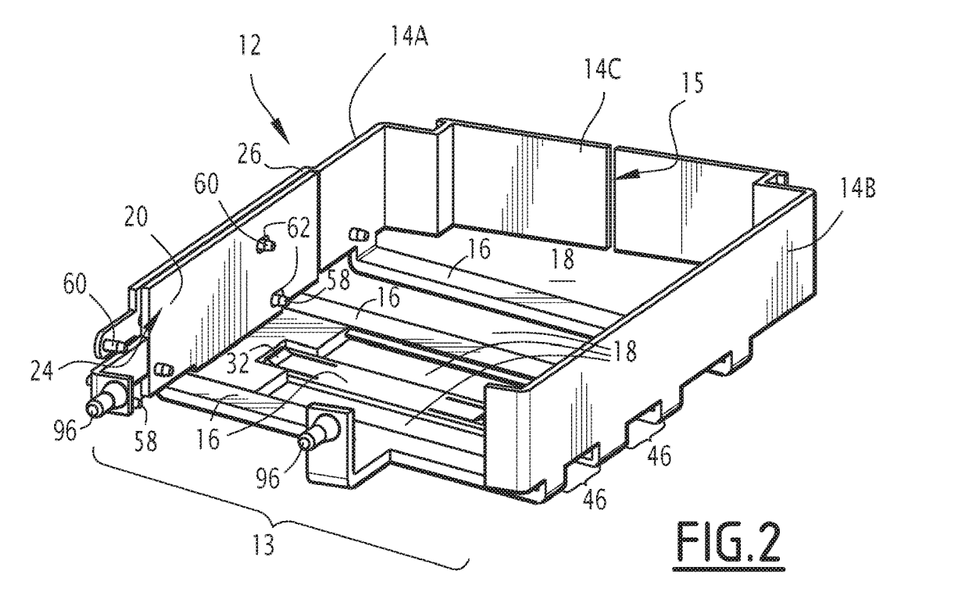

In FIG. 2, the movable wall 20 is positioned in a retracted position 24 against the internal face of one of the stationary walls 14A or 14B extending along the length of the support 12 by sliding on the bottom of the support 12.

The retracted position 24 of the movable wall 20 corresponds to a configuration for receiving a second size of a computer data back-up unit, for example of 3.5 inches, which is larger than the first size associated with the extended position 22.

The stationary wall 14A against which the movable wall 20 is positioned is shown by a broken line with an offset 26 that is designed to accommodate the thickness of the movable wall 20 in the retracted position 24 as illustrated in FIG. 2.

Such a support 12 has, for example, a length between 130 and 200 mm (or more depending on the depth of the computer or server bay into which the support is designed to be inserted), and a width of between 100 mm and 120 mm. The stationary walls 14A, 14B, 14C have, for example, a height of between 25 mm and 50 mm.

The additional movable wall 20 has a height equal to the height of the stationary walls 14A, 14B, 14C plus or minus 10%, and has a length shorter than the lengths of the longitudinal walls 14A and 14B. The length of the movable wall 20 is, for example, between 70 mm and 100 mm.

In connection with the view from below of FIG. 3, the rails 16 and the openings 18 are parallel and inclined with respect to the stationary parallel walls 14A and 14B. In particular, depending on the sliding direction 28, where the movable wall 20 is adapted to be displaced from the extended position 22 to the retracted position 24, the distance A decreases between:
 the end B of the movable wall 20 closest to the transverse wall 14C, and
 the intersection point C between the line passing through the movable wall 20 and the perpendicular line passing through the transverse wall 14C.

The rail 16 on which the movable wall 20 slides comprises latching elements 30 respectively configured to wedge the movable wall 20 at one of the extended positions 22 or retracted positions 24.

A latching element 30 of the movable wall 20 consists of a notched elastic strip formed in a slot of the rail 16 and at the end of which is placed a blocking notch 32.

Figure 3:
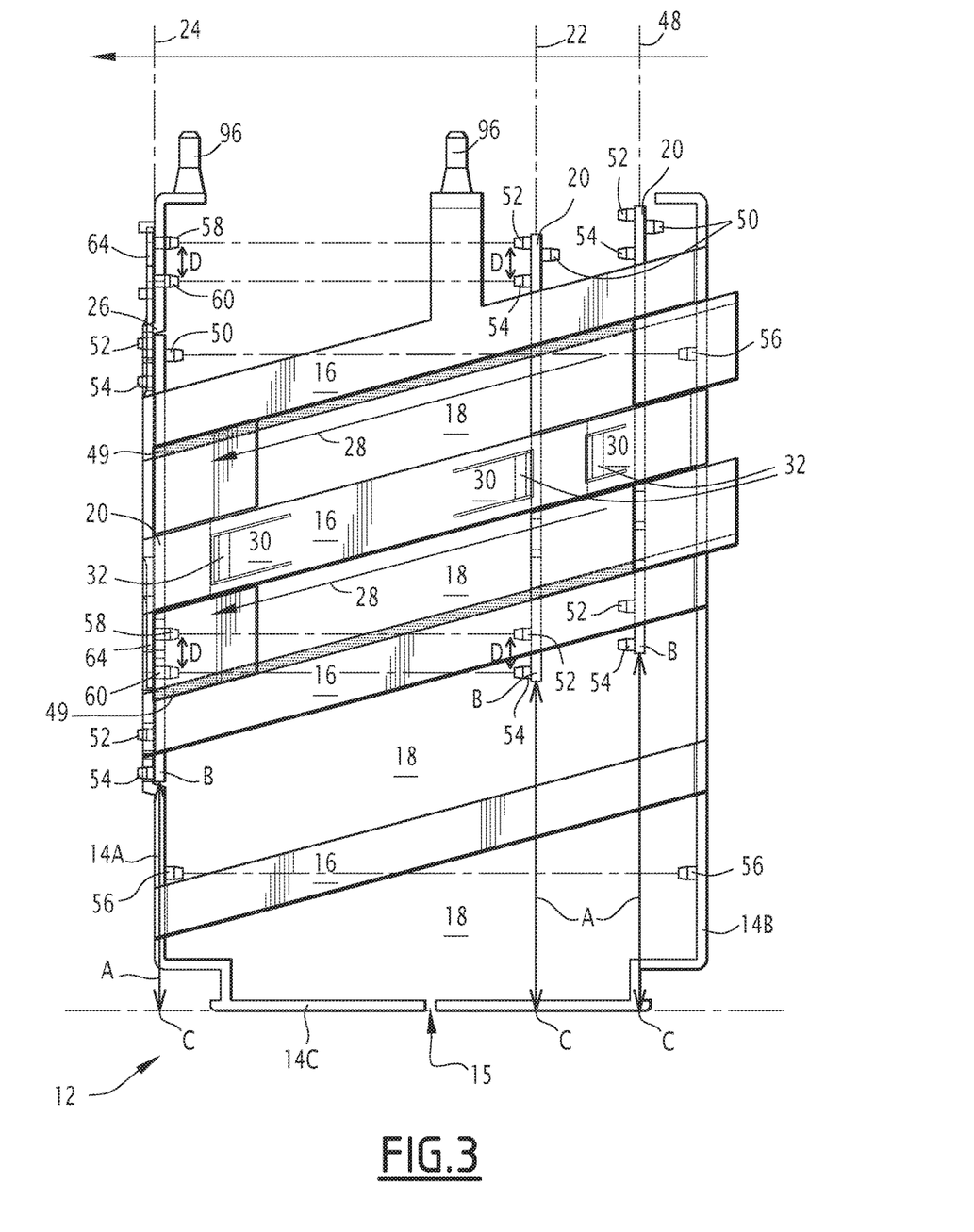
FIG. 3 shows a view from below of such a support for back-up units.

In FIG. 3, in the extended position 22, i.e. the receiving width between the stationary wall 14A of the support 12 and the movable wall 20 is 1 to 2 mm larger than the width of the data storage unit thus allowing transverse positioning freedom (i.e. mechanical play).

To promote ventilation, the material surface forming the rails 16 of the bottom of the support 12 is smaller than the surface of the openings 18.

Figure 4:
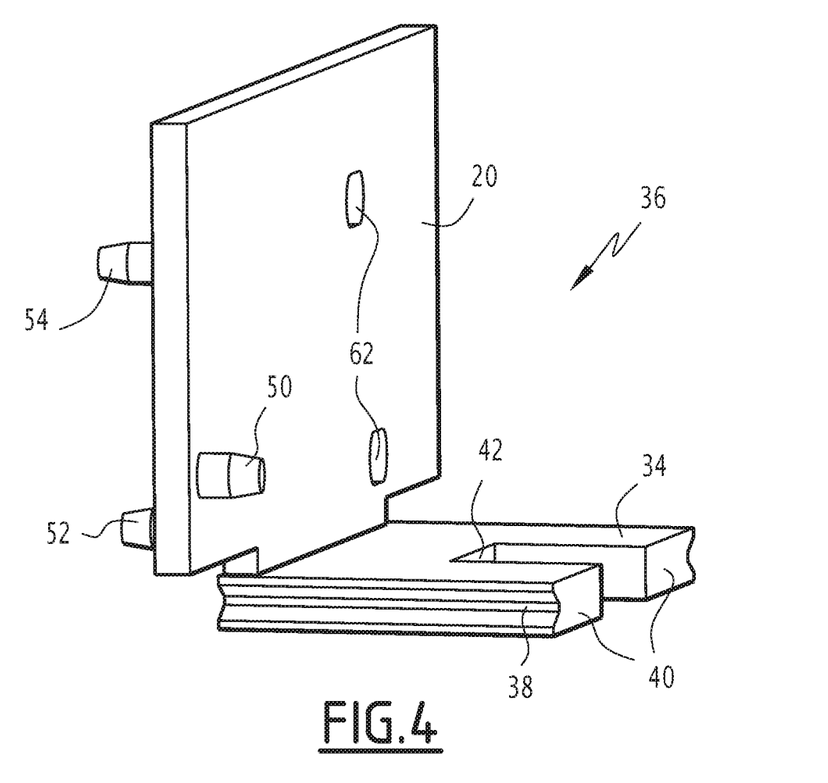
FIGS. 4 and 5 show perspective views from two distinct angles of the part carrying the movable wall, FIGS. 6 and 7 respectively show perspective views from two distinct angles, of the two receiving slots of the support illustrated in FIGS. 1 and 2 with back-up units.

In FIG. 4, the movable wall 20 is supported on a base 34 to form a movable assembly 36.

The U-shaped base 34 extends perpendicularly to the movable wall 20 and away from the stationary wall 14A with respect to the movable wall 20. In other words, the movable assembly 36 is L-shaped.

The base 34 has two grooves 38 open towards the outside of the free ends of the arms 40 of the U, and interacting with the facing edges of two non-adjacent rails 16.

In its central part 42, the base 34 comprises a lower notch 44 for the passage of the central rail 16 situated between the two rails 16 on which the movable assembly 36 slides.

The movable assembly 36 is detachable from the support 12. The wall 14B includes notches 46 for passing the free ends of the arms 40 of the base 34 when the movable assembly 36 is in the insertion position 48 illustrated in FIG. 3.

In the vicinity of the wall 14B, the non-adjacent rails 16 have recessed edges without a guide profile 49 thus enabling the movable assembly 36 to be positioned between the rails 16 in the insertion position 48. In other words, the length of the guide profiles 49 of the non-adjacent rails 16 is shorter than the length of the rails 16.

In FIG. 4, the movable wall 20 comprises, on the face facing the wall 14B, a blocking pin 50, depending on the height of the support 12, of a back-up unit when the movable wall 20 is in the retracted position 24.

Figure 5:
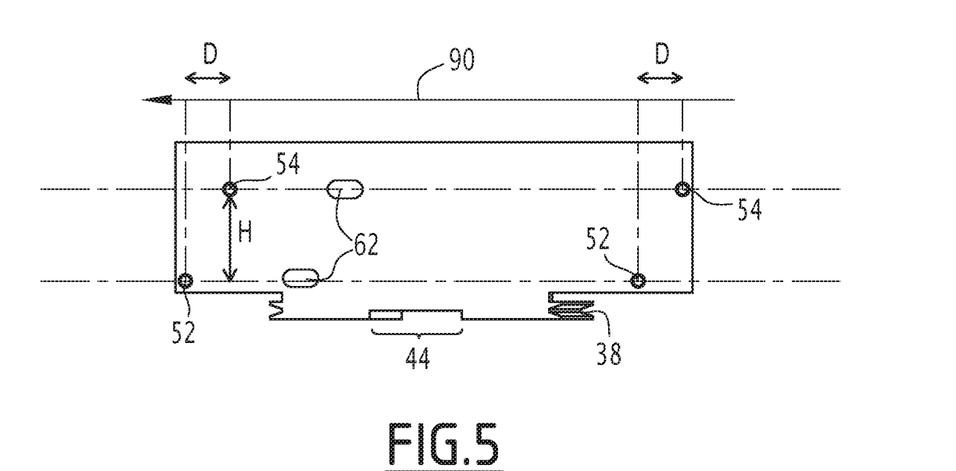

In FIG. 5, on the other face facing the wall 14B, the movable wall 20 comprises a row of two lower pins 52 and a row of two upper pins 54 for blocking, depending on the height of the support 12, of back-up units that overlap when the movable wall 20 is in the extended position 22.

These lower pins 52 and these upper pins 54 make it possible to avoid the traditional use of screws in order to hold a back-up unit on a conventional support.

In FIG. 3, the acute angle formed between the direction of the rails 16 and the inclined openings 18 of the support 12 and the perpendicular to the two parallel stationary walls 14A and 14B, is designed to align perpendicularly to the two parallel longitudinal walls 14A and 14B, with:
 the two lines of lower and upper pins 52 of the movable wall respectively with the two lines of lower pins 58 and upper pins 60 of the wall 14A when the mobile wall 20 is in the extended position 22, and
 the pin 50 of the movable wall 20 with a corresponding pin 56 of the wall 14B when the movable wall 20 is in the retracted position 24.

The pins 50, 52, 54, 56, 58, 60 are capable of supporting the lower face of a back-up unit through such as cleats, or through the insertion of such as dowels transversely into dedicated holes (i.e. tapped holes) positioned on the lateral faces and longitudinal faces of the computer data storage units.

The movable wall 20 also comprises bores 62 for the passage of the pins 58 and 60 of the wall 14A when the mobile wall 20 is in the retracted position 24. Conversely, the stationary wall 14A comprises bores 66 for the passage of the pins 54 and 52 of the movable wall 20 in the retracted position 24.

At least one of the pins 58, 60 of the wall 14A is retractable or supported on a deformable strip 64 integrated in the wall 14A.

The support 12 is made of a material, for example plastic, that is designed to deform by inserting/removing the computer data back-up units.

Figure 6:
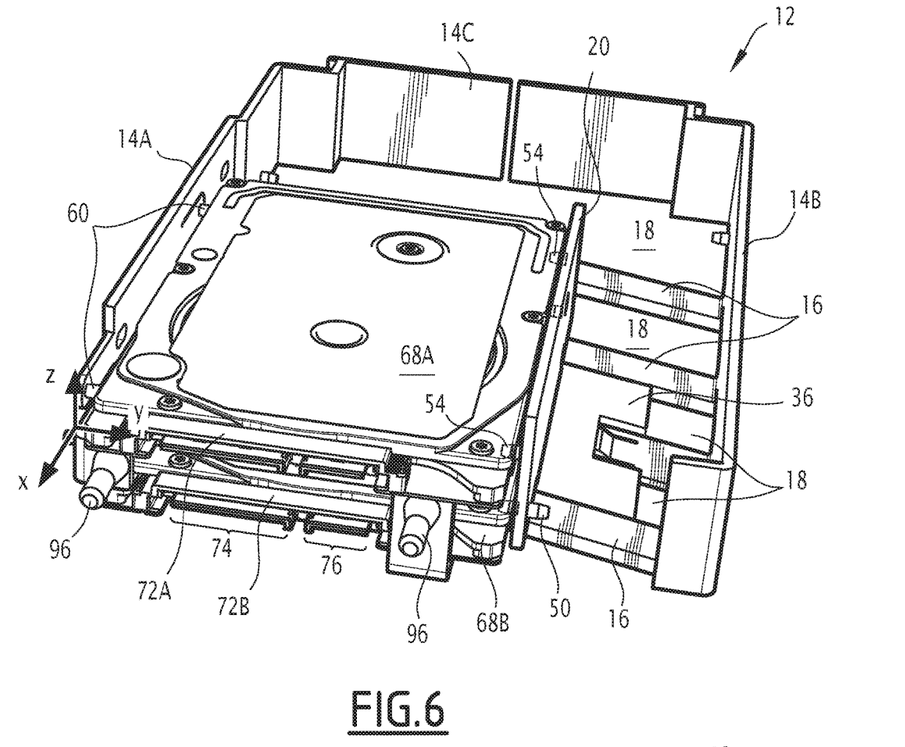

In FIG. 6, two 2.5-inch data back-up units 68A and 68B are inserted to overlap in the support 12, where the movable wall 20 is in the extended position 22.

The two 2.5-inch data back-up units 68A and 68B respectively comprise two male connectors 72A and 72B in the opening 13 of the support 12 illustrated in FIGS. 1 and 2. Each male connector 72A or 72B comprises at least one row 74 of power supply pins and at least one row 76 of data communication pins.

Figure 7:
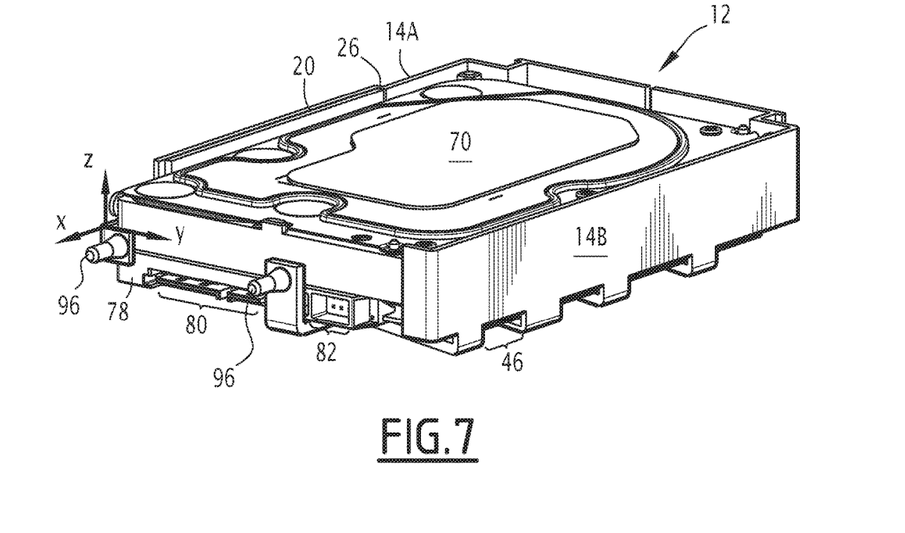

In FIG. 7, a 3.5 inch data back-up unit is inserted into the support 12 where the movable wall 20 is in the retracted position 24.

The 3.5-inch data back-up unit 70 comprises a male connector 78 in the opening 13 of the holder 12. The male connector 78 also comprises at least one row 80 of electrical power supply pins and at least one row 82 of data communication pins.

It may be seen that, in the reference (x, y, z) centered on the free end of the wall 14B, the position of the lower male connector 72B in the extended position 22 of the movable wall 20 and the position of the male connector 78 in the retracted position 24 of the movable wall 20 are identical.

In other words, the movable wall 20 is a positioning element for computer data back-up units enabling, depending on its extended position 22 or retracted position 24, the maintenance of a permanent connection position independent of the computer data back-up unit sizes.

Furthermore, there is an interdependence between the length of the pins 58 and 60 of the wall 14B, the length of the pin 50 of the movable wall 20, and the thickness of the movable wall 20.

Figure 8:
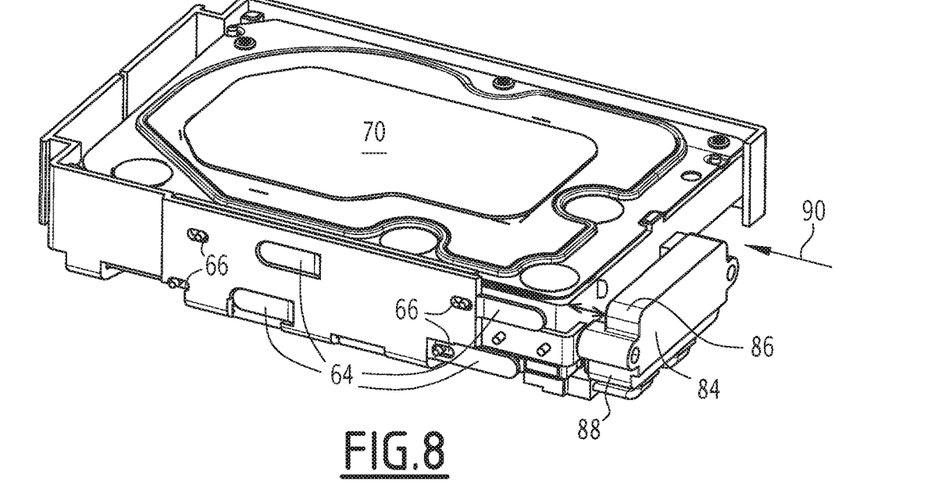
FIG. 8 shows a perspective view of the assembly of a connector to the back-up unit of the support of FIG. 7.
Figure 9:
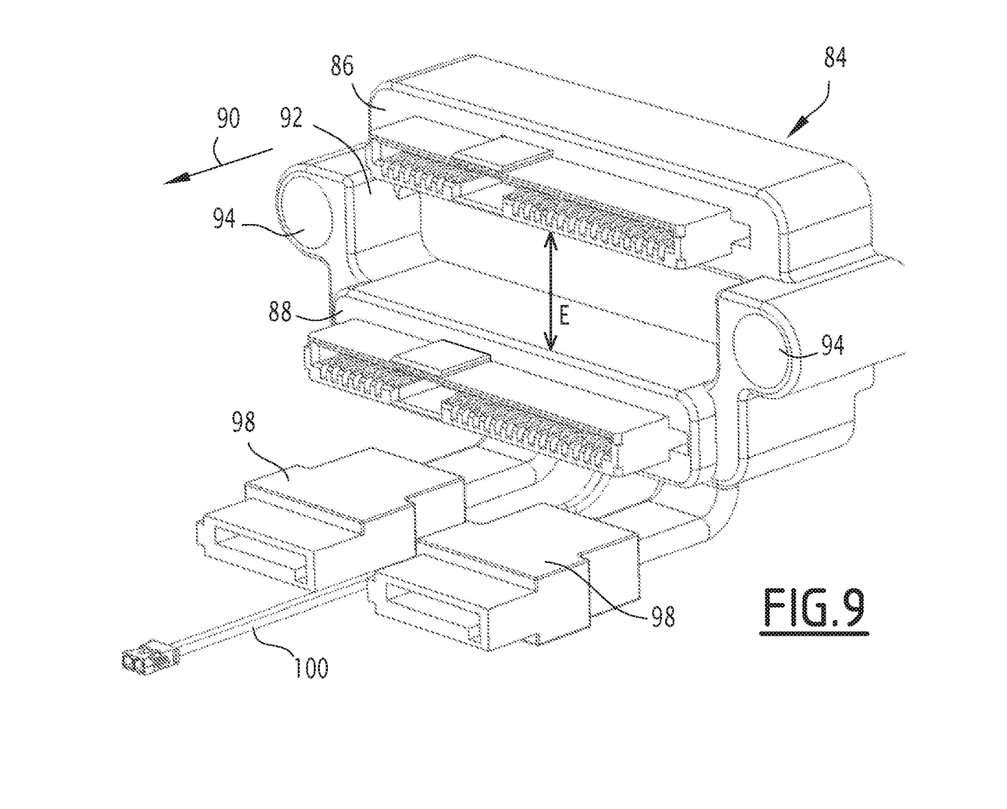
FIG. 9 shows a perspective view of the connector of FIG. 8.

In FIG. 8, a female connector 84 is assembled on the male connector 78 of the computer data back-up unit 70 of the support 12 of FIG. 7. The female connector 84 is multi-level and comprises two overlapping connection levels 86 and 88 that are joined to one another, as shown in FIG. 9. Such a multi-level connector 84 is, for example, secured to the bottom of a computer or server bay.

In FIG. 9, the upper connection level 86 of the multi-level connector 84 is offset with respect to the lower connection level 88, with a non-zero offset D towards the rear with respect to the connection direction 90 of the multi-level connector 84 to the connector(s) 78 or 72A and 72B of the computer data back-up units supported by the support 12.

Figure 10:
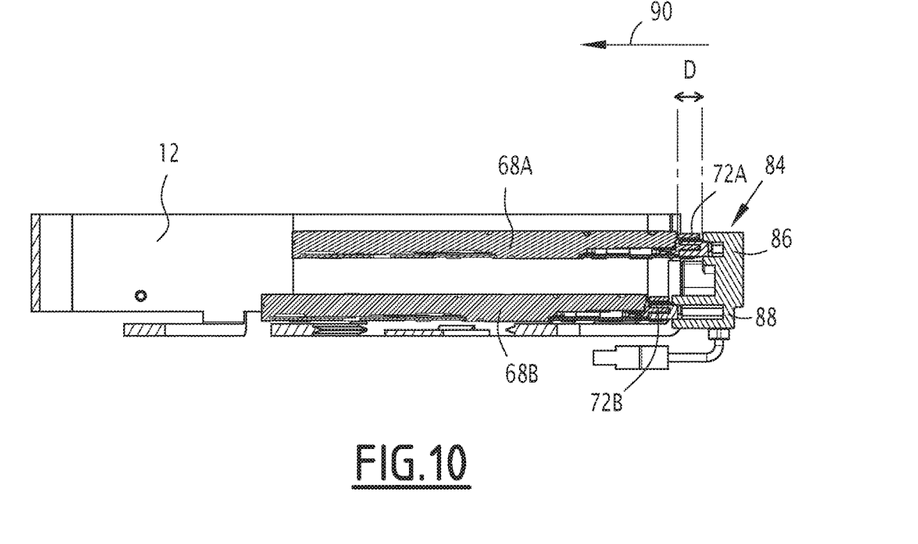
FIG. 10 shows a cross-sectional view of the assembly of the connector to the backup units of the support illustrated in FIG. 6.

Conversely, in FIG. 10, the upper male connector 72A is offset relative to the lower male connector 72B towards the rear with respect to the connection direction 90 according to the same non-zero offset D.

The offset elements of the support 12 allowing such a non-zero offset D in the direction 90 connecting the male connectors 72A and 72B of overlapping back-up units 68A and 68B are, on the one hand, the two rows of lower pins 52 and upper pins 54 supported by the movable wall 20 shown in FIGS. 3 and 5, and, on the other hand, the two rows of lower pins 58 and upper pins 60 supported on the wall 14B shown in FIG. 3.

In other words, the offset position of the lower pins 52, 58 and upper pins 54, 60 of the support 12 is complementary, according to the direction 90 of connection, to that of the lower connection levels 88 and upper levels 86 of the multi-level connector 84.

The multi-level connector 84 is formed in one piece, for example by overmolding.

Furthermore, the at least two connection levels 86 and 88 are spaced apart by a spacing level 92, depending on the height of the multi-level connector 84.

In order to promote ventilation and to allow the reception of different thicknesses of computer data back-up unit, the two rows of lower and upper pins 52 of the movable wall 20 and the corresponding two rows of lower pins 58 and upper pins 60 of the wall 14B are spaced apart at a distance H that is larger than a maximum thickness of the computer data back-up units.

Conversely, the height E of the spacing level 92 of the multi-level connector 84 depends on the distance H between the rows of pins of the support 12.

Furthermore, the spacing level 92 of the multi-level connector 84 comprises at least one opening 94 intended to interact with a connecting guide element 96 of the support 12 in the direction 90 of connection.

The multi-level connector 84 further comprises at least two SATA (Serial Advanced Technology Attachment) ports (98) respectively associated with the at least two connection levels 86 and 88 and connected to the computer or server motherboard (not shown). The multi-level connector 84 also includes a power supply port 100.

It may be seen that with such a support 12 for computer data back-up units, the changeover in size of the back-up units is manual, simple and fast.

Furthermore, this change does not require any additional tools or parts, while no part of the support 12 or of the multi-level connector 84 hinders the proper installation of a computer data storage unit in the receiving slot selected by the user.

The invention claimed is:

1. A computer data back-up unit support designed to receive at least two distinct sizes of back-up units, wherein the support comprises a bottom and at least one stationary wall perpendicular to the bottom,
    wherein the support further comprises an additional wall extending perpendicularly to the bottom of the support and parallel to one of the at least one stationary wall, wherein the additional wall is mounted to be movable in the direction of the width of the support relative to the bottom of the support between at least two receiving slots that are respectively associated with distinct receiving widths of the back-up units,
    the additional wall is supported on a base to form a movable assembly sliding in at least one rail of the bottom of the support, and
    the base is U-shaped and has two grooves that are open towards the outside of the free ends of the arms of the U-shaped base, and interact with the facing edges of two non-adjacent rails of the bottom of the support.

2. The computer data back-up unit support according to claim 1, wherein the base extends perpendicularly to the additional wall, and away from one of the at least one stationary wall with respect to the additional wall.

3. The computer data back-up unit support according to claim 1, wherein the U-shaped base comprises a notch in its central part for a passage of a central rail situated between the two non-adjacent rails on which the movable assembly slides.

4. The computer data back-up unit support according to claim 3, wherein the non-adjacent rails comprise guide profiles whose length is shorter than the rail length.

5. The computer data back-up unit support according to claim 3, wherein the center rail comprises at least two latching elements each designed to wedge the central portion of the U-shaped base to one of the at least two back-up units receiving slots respectively associated with the distinct sizes of the units.

6. The computer data back-up unit support according to claim 1, wherein the bottom of the support comprises an alternating arrangement of rails of material constituting the support and openings extending in the direction of the width of the support, wherein the rails and the openings are parallel and inclined to the perpendicular to the stationary wall.

7. The computer data back-up unit support according to claim 6, wherein a surface of the material of the bottom of the support is smaller than a surface of the openings of the bottom of the support.

8. The computer data back-up unit support according to claim 1, wherein the movable assembly is detachable from the support.

9. The computer data back-up unit support according to claim 1, wherein the additional wall comprises, on one of its faces, at least two pins designed to block, in superposition, along the height of the support, at least two back-up units of the same size.

10. The computer data back-up unit support according to claim 1, wherein at least one pin of the support is retractable or supported by a deformable strip.

11. The computer data back-up unit support according to claim 1, wherein the support is made of a material configured to deform during the insertion/removal of the back-up unit(s).

12. The computer data back-up unit support according to claim 11, wherein the material is plastic.

13. A computer data back-up unit support designed to receive at least two distinct sizes of back-up units, wherein the support comprises a bottom and at least one stationary wall perpendicular to the bottom,
  wherein the support further comprises an additional wall extending perpendicularly to the bottom of the support and parallel to one of the at least one stationary wall, wherein the additional wall is mounted to be movable in the direction of the width of the support relative to the bottom of the support between at least two receiving slots that are respectively associated with distinct receiving widths of the back-up units, wherein the additional wall comprises:
  at least one pin on one of its faces that is configured to block, along the height of the support, at least one back-up unit according to one size, and
  at least one other pin on the other face that is configured to block, along the height of the support, at least one back-up unit according to one other size.

* * * * *